United States Patent

Maeda et al.

(10) Patent No.: US 7,431,868 B2
(45) Date of Patent: Oct. 7, 2008

(54) METHOD OF MANUFACTURING A METAL SUBSTRATE FOR AN OXIDE SUPERCONDUCTING WIRE

(75) Inventors: Toshihiko Maeda, Kami-gun (JP); Toru Izumi, Sanda (JP); Katsuya Hasegawa, Tokyo (JP); Shigenobu Asada, Tokyo (JP); Teruo Izumi, Tokyo (JP); Yuh Shiohara, Chigasaki (JP)

(73) Assignees: The Furukawa Electric Co., Ltd., Tokyo (JP); International Superconductivity Technology Center, Tokyo (JP); Sumitomo Electric Industries Ltd., Osaka-shi (JP)

( * ) Notice: Subject to any disclaimer, the term of this patent is extended or adjusted under 35 U.S.C. 154(b) by 266 days.

(21) Appl. No.: 11/239,204

(22) Filed: Sep. 30, 2005

(65) Prior Publication Data

US 2006/0019832 A1 Jan. 26, 2006

Related U.S. Application Data

(63) Continuation of application No. PCT/JP2004/004587, filed on Mar. 31, 2004.

(30) Foreign Application Priority Data

Mar. 31, 2003 (JP) ............................. 2003-094792

(51) Int. Cl.
*H01B 12/00* (2006.01)
*H01L 39/24* (2006.01)
*B05D 5/12* (2006.01)

(52) U.S. Cl. .................. 252/512; 29/599; 505/473; 505/210; 505/235; 505/470; 505/490

(58) Field of Classification Search ................ 148/512; 505/490, 230, 236–238, 125, 126, 210, 211, 505/235, 470, 473; 29/599; 252/500
See application file for complete search history.

(56) References Cited

U.S. PATENT DOCUMENTS

| | | | | |
|---|---|---|---|---|
| 4,892,862 A | * | 1/1990 | Ogushi et al. | 505/473 |
| 5,190,914 A | * | 3/1993 | Koriyama et al. | 505/125 |
| 5,196,398 A | * | 3/1993 | Harada et al. | 505/473 |
| 5,334,252 A | * | 8/1994 | Yoshida et al. | 118/726 |
| 5,525,585 A | * | 6/1996 | Suh et al. | 505/490 |
| 5,648,319 A | * | 7/1997 | Morita et al. | 505/230 |
| 5,716,908 A | * | 2/1998 | Kawamoto et al. | 505/500 |
| 5,741,377 A | * | 4/1998 | Goyal et al. | 148/512 |
| 5,872,080 A | * | 2/1999 | Arendt et al. | 505/238 |
| 6,226,858 B1 | | 5/2001 | Matsumoto et al. | |
| 6,486,100 B1 | * | 11/2002 | Lee et al. | 505/470 |
| 6,743,533 B1 | * | 6/2004 | Kakimoto et al. | 428/701 |
| 6,993,823 B2 | * | 2/2006 | Kobayashi et al. | 29/599 |
| 2001/0017220 A1 | * | 8/2001 | Nakahara et al. | 174/125.1 |

FOREIGN PATENT DOCUMENTS

| | | | |
|---|---|---|---|
| EP | 0844787 A2 | * | 6/1998 |
| EP | 0884787 A2 | * | 6/1998 |
| JP | 6-231940 | | 8/1994 |
| JP | 8-050822 | | 2/1996 |
| JP | 11-003620 | | 1/1999 |
| JP | 11-053967 | | 2/1999 |
| JP | 11-086647 | | 3/1999 |
| JP | 2001-114594 | * | 4/2001 |
| JP | 2003-36742 | | 2/2003 |

OTHER PUBLICATIONS

J. Mannhart et al., "Critical Currents in [0001] Grains and across Their Tilt Boundaries in YBa2Cu3O7 Films," 1998, vol. 61, pp. 2476-2479.*
Y. Iijima et al., In-plane aligned $YBa_2Cu_3O_{7-x}$ thin films deposited on polycrystalline metallic substrates, Appl. Phys. Lett. vol. 60(1992), 769-771.
A. Ginsbach et al., Electrical and Structural Properties of $YBa_2Cu_3O_7$ Films on Poly and Single Crystalline Oxides of Cu and Ni, Physica. C185-189(1991), 2111.

* cited by examiner

*Primary Examiner*—Mark Kopec
*Assistant Examiner*—Khanh Tuan Nguyen
(74) *Attorney, Agent, or Firm*—Oblon, Spivak, McClelland, Maier & Neustadt, P.C.

(57) ABSTRACT

A metal substrate for an oxide superconducting wire, which comprises a polycrystalline metal substrate with a rolled aggregate structure having a {100} plane which is parallel to the rolled surface and a <001> axis which is parallel to the rolling direction, and an oxide crystal layer comprising an oxide of the polycrystalline metal and formed on a surface of the polycrystalline metal substrate, wherein at least 90% of grain boundaries in the oxide crystal layer have an inclination of 10° or less, and at least 90% of the {100} plane of the oxide crystal layer make an angle of 10° or less with the surface of the polycrystalline metal substrate.

14 Claims, 3 Drawing Sheets

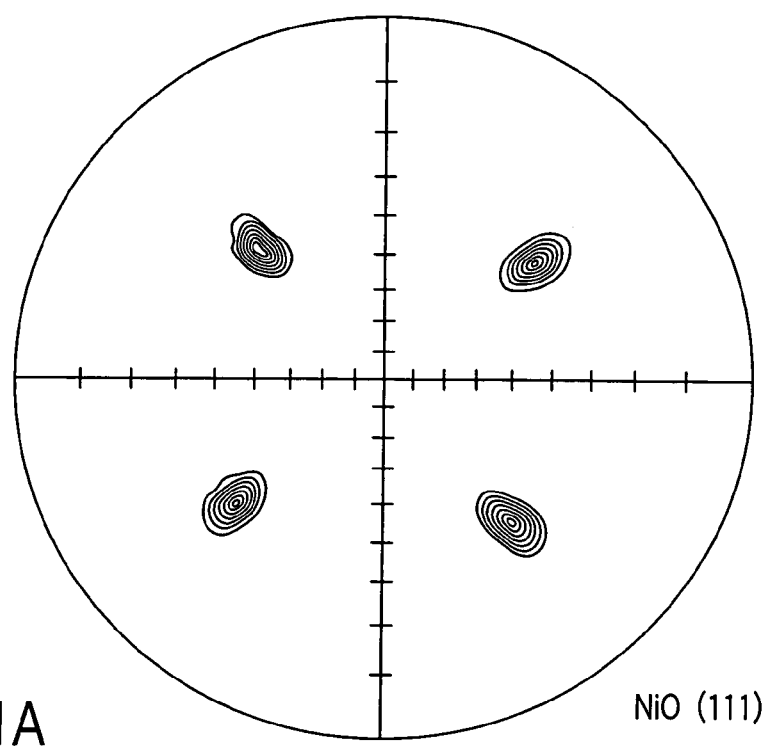
F I G. 1A
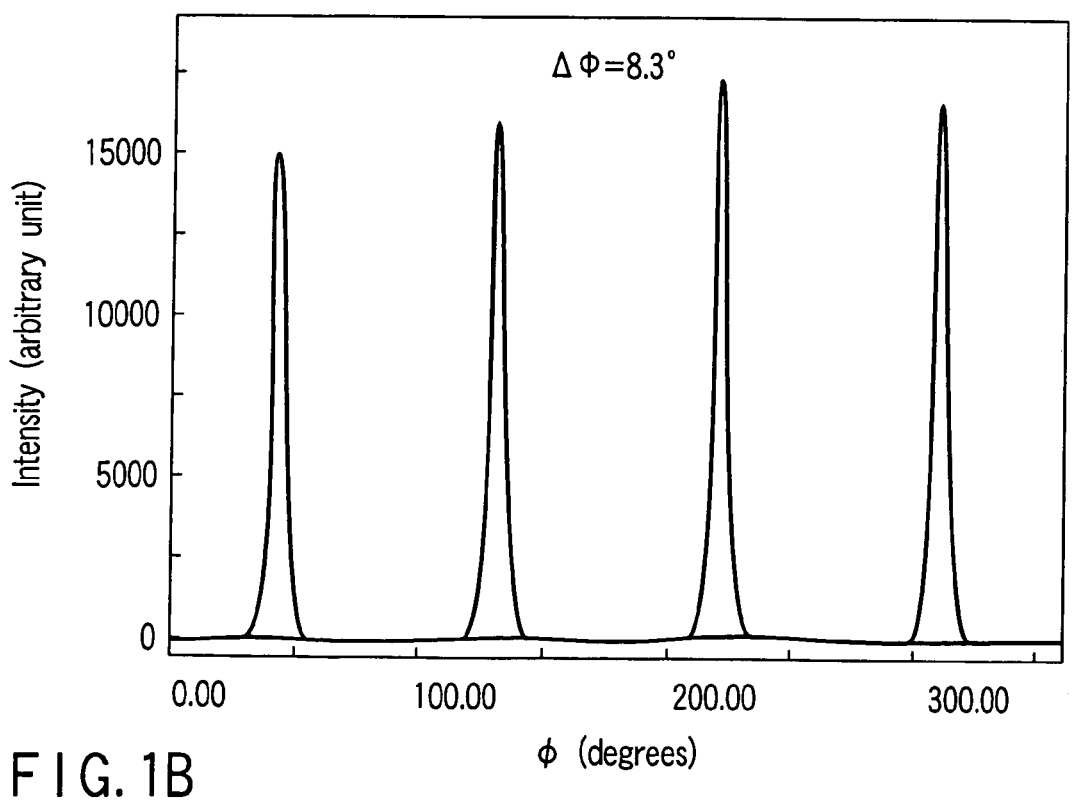
F I G. 1B

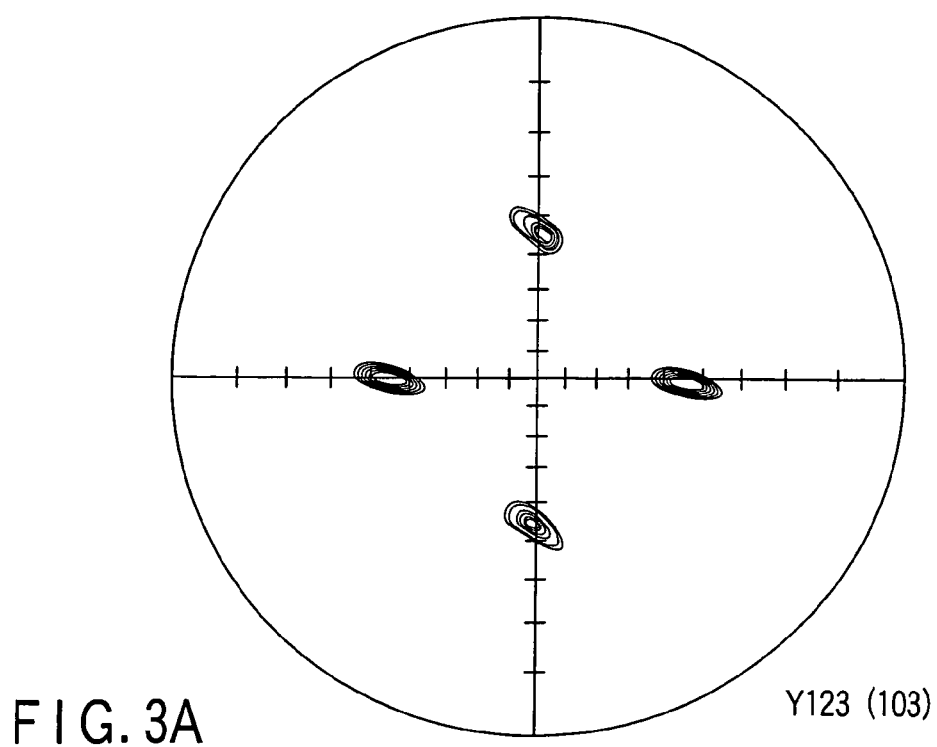
F I G. 3A
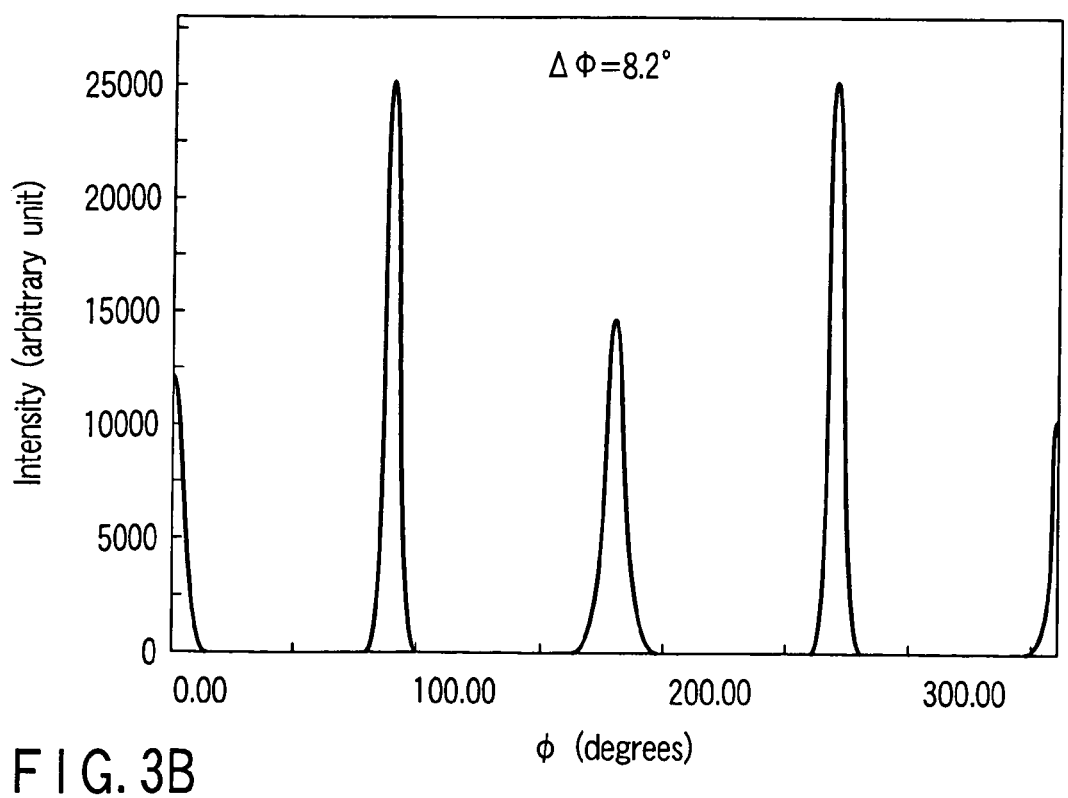
F I G. 3B ured Mar. 31, 2004, which was pub-
METHOD OF MANUFACTURING A METAL SUBSTRATE FOR AN OXIDE SUPERCONDUCTING WIRE

CROSS REFERENCE TO RELATED APPLICATIONS

This is a Continuation Application of PCT Application No. PCT/JP2004/004587, filed Mar. 31, 2004, which was published under PCT Article 21(2) in Japanese.

This application is based upon and claims the benefit of priority from prior Japanese Patent Application No. 2003-094792, filed Mar. 31, 2003, the entire contents of which are incorporated herein by reference.

BACKGROUND OF THE INVENTION

1. Field of the Invention

The present invention relates to a metal substrate for an oxide superconducting wire, an oxide superconducting wire, and a method of manufacturing the oxide superconducting wire.

2. Description of the Related Art

As for the method of manufacturing a superconducting wire by making use of an oxide superconductor, there is known a method wherein an intermediate layer having a controlled crystal orientation is formed on an elongated metal tape, and an oxide superconducting layer is formed on the intermediate layer. As a typical example of the superconducting tape-like wire obtained by this method, there is known a tape-like wire which can be obtained through a process wherein a stabilized zirconia (YSZ) is deposited on a Hastelloy tape by means of an ion beam-asisted deposition (IBAD) method, thereby controlling the crystal orientation of zirconia with c-axis thereof being oriented with the tape and a- and b-axes thereof being aligned with the tape (in-plane orientation), and a Y123($YBa_2Cu_3O_{7-y}$)-based oxide superconducting film is formed on the zirconia layer by means of a laser abrasion. Since this tape-like wire is excellent in crystal alignment of a- and b-axes thereof, the critical current density ($J_c$) would become as high as $0.5-1.0 \times 10^6 A/cm^2$ under the conditions of 77K and zero Tesla.

This method, however, is accompanied with a drawback that the film-forming rate is as very slow as 0.001-0.01 m/h, thereby raising various problems in industrial viewpoint if it is desired to manufacture a long wire (see for example, Y. Iijima et al., Appl. Phys. Lett. Vol. 60(1992), 769).

There is also reported one example wherein an oxide layer is formed on the surface of nickel tape or copper tape by oxidizing the surface thereof, and an oxide superconducting layer is formed on this oxide layer functioning as an intermediate layer (see for example, A. Ginsbach et al., Physica. CI85-189(1991), 2111).

The gist of this method resides in that an oxide film is formed on the surface of metal tape only through the oxidation of the surface of the metal tape and that the oxide film is utilized as an intermediate layer in the same manner as the aforementioned YSZ or $CeO_2$. This method is suited for mass production and hence considered as a practical method.

However, according to this method, the enhancement of orientation of oxide crystal is not taken into consideration at all. As a result, the $J_c$ of oxide superconducting layer formed on this oxide film by means of sputtering method is at most $1 \times 10^3 A/cm^2$ or so, which is as low as about one thousandth of that of the aforementioned high orientation tape wire.

With a view to overcome these problems, there has been proposed a method of manufacturing a superconducting wire wherein a polycrystalline metal substrate is subjected to rolling work, heated at a temperature of 900° C. or more in a non-oxidizing atmosphere to obtain a rolled aggregate structure where the {100} plane is parallel to the rolled surface and the <001> axis is parallel to the rolling direction (hereinafter referred to as {100}<001> crystal orientation), and further heated at a temperature of 1000° C. or more in an oxidizing atmosphere to obtain an oxide crystal layer consisting of an oxide of polycrystalline metal where 90% or more of the {100} plane is oriented so as to become parallel to the surface of the aforementioned polycrystalline metal substrate at an angle of 10° or less, and an oxide superconductor layer is deposited on this oxide crystal layer (see for example, JP Laid-open Patent Publication (Kokai) No. 11-3620 (1999)).

However, even with this method, the orientation of the oxide crystal is insufficient, thus failing to obtain a satisfactory critical current density.

The present invention has been accomplished under these circumstances and hence, the objects of the present invention are to provide a metal substrate for an oxide superconducting wire which makes it possible to form an oxide superconducting wire of high critical current density, an oxide superconducting wire exhibiting a high critical current density, and a method of manufacturing the oxide superconducting wire.

BRIEF SUMMARY OF THE INVENTION

In order to overcome the aforementioned problems, the present invention provides a metal substrate for an oxide superconducting wire, which comprises: a polycrystalline metal substrate with a rolled aggregate structure having a {100} plane which is parallel to the rolled surface and a <001> axis which is parallel to the rolling direction; and an oxide crystal layer comprising an oxide of the polycrystalline metal and formed on a surface of the polycrystalline metal substrate; wherein at least 90% of grain boundaries in the oxide crystal layer have an inclination of 10° or less; and at least 90% of the {100} plane of the oxide crystal layer make an angle of 10° or less with the surface of the polycrystalline metal substrate.

In this metal substrate for an oxide superconducting wire, the polycrystalline metal constituting the substrate may be formed of nickel or a nickel-based alloy.

Further, the present invention provides an oxide superconducting wire which comprises: a polycrystalline metal substrate with a rolled aggregate structure having a {100} plane which is parallel to the rolled surface and a <001> axis which is parallel to the rolling direction; an oxide crystal layer comprising an oxide of the polycrystalline metal and formed on a surface of the polycrystalline metal substrate; and an oxide superconductor layer formed on the oxide crystal layer; wherein at least 90% of grain boundaries in the oxide crystal layer have an inclination of 10° or less; and at least 90% of the {100} plane of the oxide crystal layer make an angle of 10° or less with the surface of the polycrystalline metal substrate.

In this case, it is preferable that at least 90% of grain boundaries in the oxide superconductor layer have an inclination which is confined to 10° or less; and at least 90% of the {100} plane of the oxide superconductor layer make an angle of 10° or less with the surface of the polycrystalline metal substrate.

Further, the oxide superconductor layer may be constituted by a crystal represented by the formula $RE_{1+x}Ba_{2-x}Cu_3O_y$ (wherein RE is one kind or two or more kinds of elements selected from the group consisting of Y, Nd, Sm, Gd, Eu, Yb and Pr).

Furthermore, the present invention provides a metal substrate for an oxide superconducting wire, comprising: subjecting a polycrystalline metal substrate with a rolled aggregate structure having a {100} plane which is parallel to the rolled surface and a <001> axis which is parallel to the rolling direction, to a first heat treatment at a low oxidizing rate in an atmosphere containing an oxidizing gas; and subjecting the polycrystalline metal substrate that has been subjected to the first heat treatment to a second heat treatment at a high oxidizing rate in an atmosphere containing an oxidizing gas to thereby form an oxide crystal layer where at least 90% of the grain boundary have an inclination of 10° or less.

Incidentally, the oxidizing gas is a gas capable of exhibiting an oxidizing effect such as $O_2$, $H_2O$, $O_3$, etc.

In the method of manufacturing a metal substrate for an oxide superconducting wire according to the present invention, the oxidizing rate of the first heat treatment may preferably be confined within the range of 0.01-0.2 μm/hr, and the oxidizing rate of the second heat treatment may preferably be confined within the range of 1-10 μm/hr.

Further, the first heat treatment may preferably be performed in an atmosphere containing a smaller quantity of oxidizing gas than that contained in the second heat treatment. More specifically, the temperature of heat treatment in the first heat treatment may preferably be higher than 247° C. and not higher than 1200° C., and the temperature of heat treatment in the second heat treatment may preferably be higher than 800° C. and not higher than 1300° C.

The heat-treating atmosphere in the first heat treatment may be an atmosphere containing a minute amount of an oxidizing gas that can be created by continuously drawing a vacuum while flowing argon gas therein. The heat-treating atmosphere in the second heat treatment may be an atmosphere containing a large quantity of an oxidizing gas.

In the method of manufacturing a metal substrate for an oxide superconducting wire according to the present invention as described above, due to the first heat treatment where the oxidizing rate is confined low, an oxide film which is excellent in orientation and very thin in film thickness, for example 100-1000 nm, is formed at first, and then, due to the second heat treatment where the oxidizing rate is higher than that of the first heat treatment, an oxide film having a prescribed film thickness, for example 1000-10000 nm, is formed. Although the second heat treatment is performed at a high oxidizing rate as in the case of the conventional method, since an oxide film which is excellent in orientation is already formed in the first heat treatment, the oxide film to be obtained is excellent in orientation, i.e. at least 90% of inclination of grain boundary is confined to 10° or less, even if the oxide film is subjected to heat treatment of high oxidizing rate.

Furthermore, the present invention provides a method of manufacturing an oxide superconducting wire, comprising: subjecting a polycrystalline metal substrate with a rolled aggregate structure having a {100} plane which is parallel to the rolled surface and a <001> axis which is parallel to the rolling direction to a first heat treatment at a low oxidizing rate in an atmosphere containing a minute amount of oxidizing gas; subjecting the polycrystalline metal substrate that has been subjected to the first heat treatment to a second heat treatment at a high oxidizing rate in an atmosphere containing a large quantity of oxidizing gas to thereby form an oxide crystal layer where at least 90% of grain boundary have the inclination of 10° or less; and forming an oxide superconductor layer on a surface of the oxide crystal layer.

In this case, the oxide superconductor layer may preferably be formed by means of laser abrasion or by means of liquid phase epitaxy.

In the method of manufacturing an oxide superconducting wire according to the present invention as described above, since an oxide crystal layer which is excellent in orientation, i.e. at least 90% of inclination of grain boundary is confined to 10° or less, is already formed on a surface of the polycrystalline metal substrate as described above, the oxide superconductor layer to be formed thereon is also excellent in orientation. As a result, it is possible to obtain an oxide superconducting wire exhibiting a high critical current density.

BRIEF DESCRIPTION OF THE SEVERAL VIEWS OF THE DRAWING

FIG. 1A is a pole figure of the oxide crystal layer obtained in Example 1;

FIG. 1B is a graph showing a pattern of angle distribution of the oxide crystal layer obtained in Example 1;

FIG. 3A is a pole figure of the oxide superconductor layer obtained in Example 3; and FIG. 3B is a graph showing a pattern of angle distribution of the oxide superconductor layer obtained in Example 3.

DETAILED DESCRIPTION OF THE INVENTION

Figure 2A:
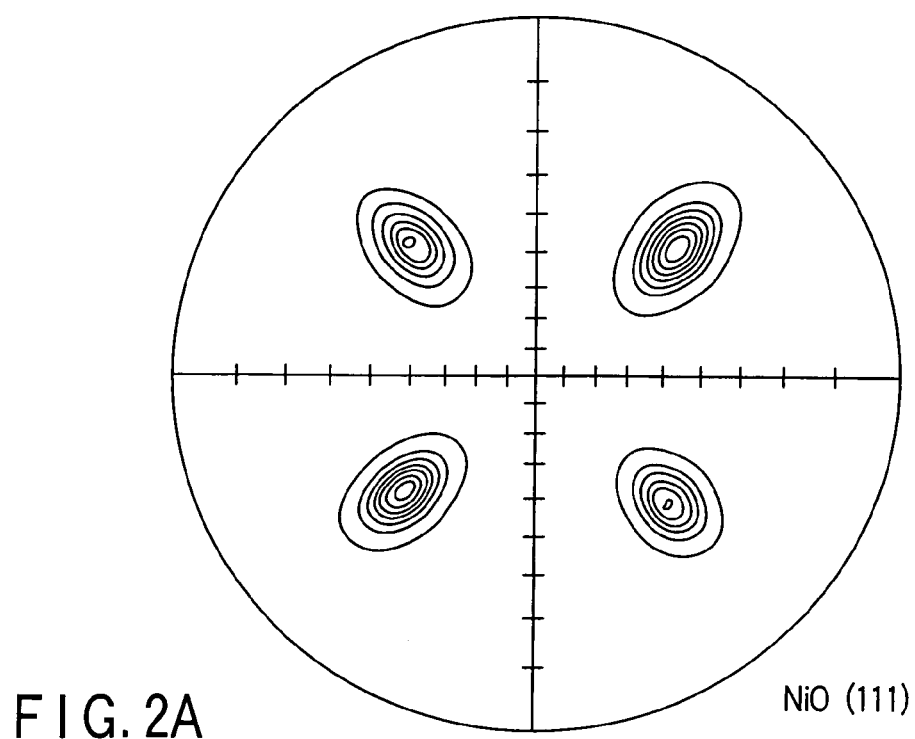
FIG. 2A is a pole figure of the oxide crystal layer obtained in Comparative Example.

Next, the present invention will be more specifically explained by showing specific embodiments of the present invention.

The metal substrate for an oxide superconducting wire according to a first aspect of the present invention is characterized in that an oxide crystal layer exhibiting excellent in-plane orientation, i.e. at least 90% of grain boundaries thereof have an inclination which is confined to 10° or less, and also exhibiting excellent out-of-plane orientation, i.e. at least 90% of the {100} plane thereof make an angle of 10° or less with the surface of the polycrystalline metal substrate, is formed on the surface of the polycrystalline metal substrate. This kind of oxide crystal layer can be formed by subjecting the surface of polycrystalline metal substrate to two-stage oxidizing treatments in an atmosphere containing an oxidizing gas.

As for the oxidizing gas useful in the present invention, it is possible to employ $O_2$, $H_2O$, $O_3$, etc.

The polycrystalline metal substrate is required to have a rolled aggregate structure having a {100} plane which is parallel to the rolled surface and a <001> axis which is parallel to the rolling direction. Unless the polycrystalline metal substrate is provided with this rolled aggregate structure, it would be impossible to form an excellent oxide crystal layer and an oxide superconductor layer both excellent in orientation on the surface of the polycrystalline metal substrate. A polycrystalline metal substrate having such a rolled aggregate structure can be obtained, for example, through rolling work and heat treatment in a non-oxidizing atmosphere.

As for the materials for polycrystalline metal substrate, it is preferable to employ nickel or nickel-based alloys. As for the nickel-based alloys, it is possible to employ nickel-chromium, nickel-vanadium, nickel-silicon, nickel-aluminum, nickel-zinc, nickel-copper, etc.

The two-stage oxidizing treatments in an atmosphere containing an oxidizing gas is consisted of a first heat treatment where the oxidizing rate is relatively low, and a second heat treatment where the oxidizing rate is relatively high. The oxidizing rate in the first heat treatment may preferably be confined within the range of 0.01-0.2 μm/hr, and the oxidizing rate in the second heat treatment may preferably be confined within the range of 1-10 μm/hr.

If the oxidizing rate in the first heat treatment is faster than 0.2 μm/hr, it would become difficult to obtain an oxide crystal layer which is excellent in orientation. On the other hand, if the oxidizing rate in the first heat treatment is lower than 0.01 μm/hr, it would take too long time in obtaining a prescribed film thickness, thus raising a problem that the working efficiency would be deteriorated. Likewise, if the oxidizing rate in the second heat treatment is faster than 10 μm/hr, it would become difficult to obtain an oxide crystal layer which is excellent in orientation. On the other hand, if the oxidizing rate in the second heat treatment is lower than 1 μm/hr, it would take too long time in obtaining a prescribed film thickness, thus raising a problem that the working efficiency would be deteriorated.

The first heat treatment may preferably be performed in an atmosphere containing a smaller quantity of oxidizing gas than that contained in the second heat treatment. More specifically, the temperature of heat treatment in the first heat treatment may be higher than 247° C. and not higher than 1200° C., and the temperature of heat treatment in the second heat treatment may be higher than 800° C. and not higher than 1300° C.

If the temperature of heat treatment in the first heat treatment is not higher than 247° C., it would be practically impossible to obtain an oxide crystal. On the other hand, if the temperature of heat treatment in the first heat treatment is higher than 1200° C., the oxidizing rate would become too fast so that it would be difficult to obtain an oxide crystal layer excellent in orientation. On the other hand, if the temperature of heat treatment in the second heat treatment is not higher than 800° C., the oxidizing rate would become too slow, thereby raising problem of working efficiency. If the temperature of heat treatment in the second heat treatment is higher than 1300° C., it would be difficult to obtain an oxide crystal layer excellent in orientation.

The atmosphere in the first heat treatment may preferably be an atmosphere containing a minute quantity of oxidizing gas. This kind of atmosphere can be created by continuously drawing a vacuum while flowing argon gas therein until an atmosphere containing a minute quantity of oxidizing gas can be obtained. The heat-treating atmosphere in the second heat treatment is an atmosphere containing a larger quantity of an oxidizing gas than that of the atmosphere in the first heat treatment. This atmosphere containing a larger quantity of an oxidizing gas may be air atmosphere.

The partial pressure of the oxidizing gas in the atmosphere in the first heat treatment may preferably be $10^{-5}$ atm or less if oxygen is employed as the oxidizing gas, and the partial pressure of the oxygen gas in the atmosphere in the second heat treatment may preferably be 0.2 atm or more.

According to the method provided by the first aspect of the present invention as described above, it is possible to obtain a metal substrate for an oxide superconducting wire wherein an oxide crystal layer exhibiting excellent in-plane orientation, i.e., at least 90% of grain boundaries thereof have an inclination which is confined to 10° or less, and also exhibiting excellent out-of-plane orientation, i.e. at least 90% of the {100} plane thereof make an angle of 10° or less with the surface of the polycrystalline metal substrate, is formed on the surface of the polycrystalline metal substrate.

The oxide superconducting wire according to the second aspect of the present invention is featured in that an oxide superconductor layer is formed on the surface of the metal substrate for an oxide superconducting wire to be obtained according to the first aspect of the present invention.

In this oxide superconducting wire, at least 90% of grain boundaries in the oxide superconductor layer have an inclination which is confined to 10° or less; and at least 90% of the {100} plane of the oxide superconductor layer make an angle of 10° or less with the surface of the polycrystalline metal substrate. Namely, since an oxide film exhibiting excellent orientation, i.e. at least 90% of grain boundaries thereof is confined to 10° or less, is formed on the surface of the metal substrate for an oxide superconducting wire to be obtained according to the first aspect of the present invention, the oxide superconductor layer to be formed on the oxide film is enabled to exhibit an excellent orientation, i.e. at least 90% of grain boundaries thereof is confined to 10° or less and at least 90% of the {100} plane thereof make an angle of 10° or less with the surface of the polycrystalline metal substrate.

As for the oxide superconductor layer, it is possible to employ an ordinary superconductor, e.g. a superconductor represented by the formula $RE_{1+x}Ba_{2-x}Cu_3O_y$ (wherein RE is one kind or two or more kinds of elements selected from the group consisting of Y, Nd, Sm, Gd, Eu, Yb and Pr).

In order to prevent the diffusion of atoms constituting the substrate material into the oxide superconductor layer, a diffusion barrier layer may be formed on the surface of oxide crystalline layer prior to the step of forming the oxide superconductor layer. As for the diffusion barrier layer, it is possible to employ $BaZrO_3$, $CeO_2$, $Y_2O_3$, etc.

The formation of the oxide superconductor layer can be performed by means of laser abrasion or by means of liquid phase epitaxial method. Although it is generally possible, according to the laser abrasion, to a film of oxide superconductor at a high speed, it is required, in order to create a film of high quality, to keep the substrate at a high temperature, i.e. about 700-800° C. On the other hand, in the case of the liquid phase epitaxial method which makes it possible to perform a high-speed film-forming, since the substrate is immersed in a high-temperature melt of 900-1000° C., it would be difficult to deposit the oxide superconductor layer directly on a metal substrate of low melting point.

As described above, when nickel or nickel-based alloys, both high in melting point, are employed as a polycrystalline metal substrate, it is possible to deposit an oxide superconductor layer by means of laser abrasion or liquid phase epitaxial method.

According to the method provided by the second aspect of the present invention as described above, since an oxide film excellent in orientation, i.e., at least 90% of grain boundaries thereof have an inclination which is confined to 10° or less and at least 90% of the {100} plane thereof make an angle of 10° or less with the surface of the polycrystalline metal substrate, is formed in advance on the surface of substrate, it is possible to form, through this oxide film, an oxide superconductor layer excellent in orientation on the surface of substrate. As a result, it is possible to obtain an oxide superconducting wire which is high in critical current density.

Next, the examples of the present invention and comparative example will be explained.

EXAMPLE 1

A polycrystalline nickel substrate having a rolled aggregate structure having a {100} plane which is parallel to the rolled surface and a <001> axis which is parallel to the rolling direction was prepared. This substrate was placed in a heating furnace and subjected to a first heat treatment for 20 hours at a temperature of 750° C. and in an atmosphere containing a minute quantity of oxidizing gas created by continuously evacuating the heating furnace while introducing argon gas therein. Incidentally, when an average film-forming speed of this first heat treatment was measured, it was 0.15 μm/hr.

Although an NiO layer excellent in orientation was already formed at this stage, the thickness thereof was as thin as not more than 3 μm, so that it was most probable that the NiO layer would be vanished as the surface thereof was polished. Therefore, in order to secure the thickness of the NiO layer, a second stage heat treatment was performed as follows.

Namely, the polycrystalline nickel substrate having a thin NiO film formed thereon by the first heat treatment was further subjected to a second heat treatment in a heating furnace for one hour at a temperature of 1000° C. and in air atmosphere to form an NiO film having a thickness of 4 μm. When an average film-forming speed of this second heat treatment was measured, it was 1 μm/hr.

By making use of the polycrystalline nickel substrate having an NiO film formed thereon and obtained as described above, the inclination of grain boundary of the NiO film was measured. The inclination of grain boundary was determined as follows. Namely, a pole figure of the NiO film was prepared by means of X-ray diffraction and then, by scanning this pole figure, an X-ray diffraction pattern was obtained. Then, a half band width $\Delta\Phi$ was determined from the X-ray diffraction pattern, thus obtaining the inclination of grain boundary.

The results are shown in FIGS. 1A and 1B. FIG. 1A shows the pole figure, and FIG. 1B shows a pattern of angle ($\Phi$) distribution ($\Phi$ corresponds to the angle of rotation of the sample) which was obtained through the scanning, in counterclockwise, of the pole figure of FIG. 1A. From FIGS. 1A and 1B, it was possible to obtain a half band width $\Delta\Phi=8.3°$. As seen from above results, it was confirmed that the NiO layer formed in this example was formed of a crystal exhibiting a high degree of orientation in-plane.

When the angle of the {100} plane of the NiO layer to the surface of substrate was measured by making use of an X-ray diffraction rocking curve, the angle was 8.5°, thus finding out that the NiO layer was excellent in orientation even in out-of-plane.

EXAMPLE 2

A polycrystalline nickel substrate having a rolled aggregate structure having a {100} plane which is parallel to the rolled surface and a <001> axis which is parallel to the rolling direction was prepared. This substrate was placed in a heating furnace and subjected to a first heat treatment for one hour at a temperature of 1100° C. and in an atmosphere containing a minute quantity of oxidizing gas created by continuously evacuating the heating furnace while introducing argon gas therein.

Although an NiO layer excellent in orientation was already formed at this stage, the thickness thereof was as thin as not more than 1 μm, so that it was most probable that the NiO layer would be vanished as the surface thereof was polished. Therefore, in order to secure the thickness of the NiO layer, a second stage heat treatment was performed as follows.

Namely, the polycrystalline nickel substrate having a thin NiO film formed thereon by the first heat treatment was further subjected to a second heat treatment in a heating furnace for two hours at a temperature of 1200° C. and in air atmosphere to form an NiO film having a thickness of 6 μm. When the average film-forming speed of this second heat treatment was measured, it was 6 μm/hr.

By making use of the polycrystalline nickel substrate having an NiO film formed thereon and obtained as described above, the inclination of grain boundary of the NiO film was measured. The inclination of grain boundary was determined as follows. Namely, a pole figure of the NiO film was prepared by means of X-ray diffraction and then, by scanning this pole figure, an X-ray diffraction pattern was obtained. Then, a half band width $\Delta\Phi$ was determined from the X-ray diffraction pattern, thus obtaining the inclination of grain boundary.

As a result, a half band width $\Delta\Phi=8.3°$ was obtained. As seen from above results, it was confirmed that the NiO layer formed in this example was formed of a crystal exhibiting a high degree of orientation in-plane.

COMPARATIVE EXAMPLE

By making use of the same polycrystalline nickel substrate as employed in Example 1 was subjected to heat treatment in the same manner as conventionally performed, i.e., for one hour at a temperature of 1000° C. and in air atmosphere to form a NiO film. When the average film-forming speed of this heat treatment was measured, it was 5 μm/hr.

Figure 2B:
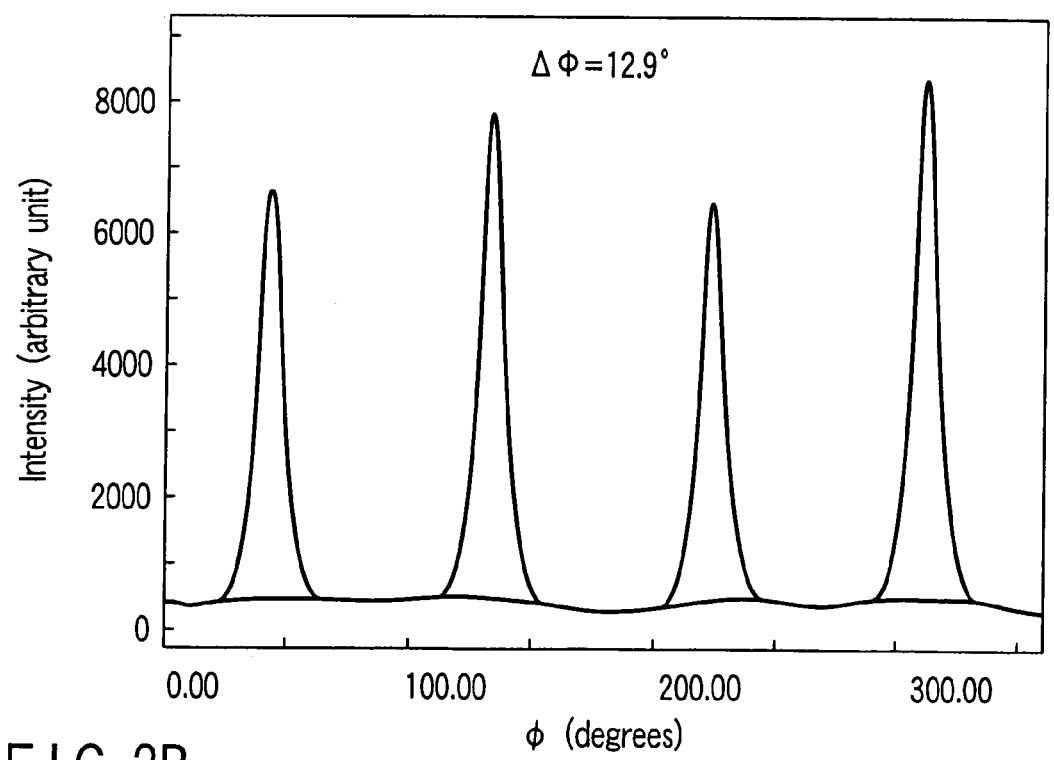
FIG. 2B is a graph showing a pattern of angle distribution of the oxide crystal layer obtained in Comparative Example.

FIGS. 2A and 2B show the pole figure of the NiO film and a pattern of angle distribution of the NiO film, respectively. It will be seen from FIGS. 2A and 2B that in this comparative example, since the surface of substrate was rapidly oxidized in a high oxidizing gas atmosphere, the half band width $\Delta\Phi$ thereof was 12.9°, which was much higher than that of Example 1, thus deteriorating the in-plane orientation thereof.

When the angle of the {100} plane of the NiO layer to the surface of substrate was measured by making use of X-ray diffraction, the angle was 14.0°, thus finding out that the NiO layer was poor in orientation even in out-of-plane.

EXAMPLE 3

The surface of the substrate obtained in Example 1 was buffed to obtain a polished surface on which a $BaZrO_3$ film was formed as a diffusion barrier layer by means of laser abrasion using KrF excimer laser. The deposition of the $BaZrO_3$ film was performed in an Ar gas atmosphere of 20 mm Torr in pressure with the repeating frequency of laser being set to the range of 10-20 Hz and the temperature of the substrate being controlled to 600-700° C.

On this diffusion barrier layer formed in this manner, a Y123 oxide superconductor layer was formed by means of laser abrasion. The deposition of the Y123 oxide superconductor layer was performed in an $O_2$ gas atmosphere of 100-200 mm Torr in pressure with the repeating frequency of laser being set to the range of 10-20 Hz and the temperature of the substrate being controlled to 700-800° C.

On this Y123 oxide superconductor layer was further deposited a Y—Yb123 oxide superconductor layer by means of liquid phase epitaxy. More specifically, powder of $Yb_2BaCuO_3$ was placed at the bottom portion of crucible and then a mixture of $3BaCuO_2+5CuO$ was placed over the powder. The resultant crucible made of $Y_2O_3$ was heated in an electric furnace to melt these materials placed therein. The surface of the resultant melt was kept at a temperature of 950°-970° C. and then a sample was immersed in the melt to form a Y—Yb123 oxide superconductor layer.

FIGS. 3A and 3B show the pole figure and a pattern of angle distribution of the Y—Yb123 oxide superconductor layer thus obtained, respectively. From FIGS. 3A and 3B, it was possible to obtain a half band width $\Delta\Phi=8.2°$. Thus, it was possible to confirm that since the oxide superconductor layer thus obtained had succeeded to the excellent orientation of the underlying layer, it was possible to enable the oxide superconductor layer to have excellent in-plane orientation.

As explained above, according to the present invention, it is possible to provide a metal substrate for an oxide superconducting wire having an oxide crystal layer formed on the surface thereof and exhibiting excellent in-plane orientation and out-of-plane orientation which the prior art failed to achieve. Further, since it is designed such that an oxide superconductor layer is deposited on this metal substrate for an oxide superconducting wire, it is possible to obtain an oxide superconductor excellent in orientation, thus making it possible to obtain an oxide superconducting wire of high critical current density.

What is claimed is:

1. A method of manufacturing a metal substrate for an oxide superconducting wire, comprising:
subjecting a polycrystalline metal substrate with a rolled aggregate structure having a {100} plane which is parallel to the rolled surface and a <001> axis which is parallel to the rolling direction, to a first heat treatment at a low oxidizing rate in an atmosphere containing an oxidizing gas; and
subjecting the polycrystalline metal substrate that has been subjected to the first heat treatment to a second heat treatment at a high oxidizing rate in an atmosphere containing an oxidizing gas to thereby form an oxide crystal layer where at least 90% of the grain boundary have an inclination of 10° or less,
wherein at least 90% of the {100} plane of the oxide crystal layer make an angle of 10° or less with the surface of the polycrystalline metal substrate.

2. The method according to claim 1, wherein the oxidizing rate of the first heat treatment is confined within the range of 0.01-0.2 μm/hr, and the oxidizing rate of the second heat treatment is confined within the range of 1-10 μm/hr.

3. The method according to claim 1, wherein the first heat treatment is performed in an atmosphere containing a smaller quantity of oxidizing gas than that contained in the second heat treatment.

4. The method according to claim 1, wherein the temperature of heat treatment in the first heat treatment is higher than 247° C. and not higher than 1200° C., and the temperature of heat treatment in the second heat treatment is higher than 800° C. and not higher than 1300° C.

5. The method according to claim 1, wherein the atmosphere in the first heat treatment contains a minute amount of an oxidizing gas and created by continuously drawing a vacuum while flowing argon gas therein, and the atmosphere in the second heat treatment contains a large quantity of an oxidizing gas.

6. The method according to claim 1, wherein the polycrystalline metal is nickel or a nickel-based alloy.

7. A method of manufacturing an oxide superconducting wire, comprising:
subjecting a polycrystalline metal substrate with a rolled aggregate structure having a {100} plane which is parallel to the rolled surface and a <001> axis which is parallel to the rolling direction to a first heat treatment at a low oxidizing rate in an atmosphere containing an oxidizing gas;
subjecting the polycrystalline metal substrate that has been subjected to the first heat treatment to a second heat treatment at a high oxidizing rate in an atmosphere containing an oxidizing gas to thereby form an oxide crystal layer where at least 90% of grain boundary have the inclination of 10° or less, and wherein at least 90% of grain boundaries in the oxide superconductor layer have an inclination of 10° or less; and at least 90% of the {100} plane of the oxide superconductor layer make an angle of 10° or less with the surface of the polycrystalline metal substrate; and
forming an oxide superconductor layer on a surface of the oxide crystal layer.

8. The method according to claim 7, wherein the oxidizing rate of the first heat treatment is confined within the range of 0.01-0.2 μm/hr, and the oxidizing rate of the second heat treatment is confined within the range of 1-10 μm/hr.

9. The method according to claim 7, wherein the first heat treatment is performed in an atmosphere containing a smaller quantity of oxidizing gas than that contained in the second heat treatment.

10. The method according to claim 9, wherein the temperature of heat treatment in the first heat treatment is higher than 247° C. and not higher than 1200° C., and the temperature of heat treatment in the second heat treatment is higher than 800° C. and not higher than 1300° C.

11. The method according to claim 7, wherein the atmosphere in the first heat treatment contains a minute amount of an oxidizing gas and created by continuously drawing a vacuum while flowing argon gas therein, and the atmosphere in the second heat treatment contains a large quantity of an oxidizing gas.

12. The method according to claim 7, wherein the polycrystalline metal is nickel or a nickel-based alloy.

13. The method according to claim 7, wherein at least 90% of the {100} plane of the oxide crystal layer make an angle of 100 or less with the surface of the polycrystalline metal substrate.

14. The method according to claim 7, wherein the oxide superconductor layer is formed by means of laser abrasion or by means of liquid phase epitaxy.

* * * * *